United States Patent [19]

Ogawa et al.

[11] Patent Number: 5,410,956

[45] Date of Patent: May 2, 1995

[54] VACUUM HOT PLATEN PRESS WITH AIRTIGHT COVERS IN SLIDING CONTACT WITH TENSILE STRENGTH MEMBERS

[75] Inventors: Masahiko Ogawa, Nagoya; Koukichi Isobe, Tokai; Takayuki Kouno, Owariasahi, all of Japan

[73] Assignee: Meiki Co., Ltd., Ohbu, Japan

[21] Appl. No.: 83,175

[22] Filed: Jun. 29, 1993

[30] Foreign Application Priority Data

Jun. 30, 1992 [JP] Japan .................................. 4-196099

[51] Int. Cl.⁶ ......................... B30B 15/34; B30B 7/02
[52] U.S. Cl. ..................................... 100/90; 100/93 P; 100/194; 156/382; 156/583.1; 425/338; 425/405.1
[58] Field of Search ......................... 100/90, 93 P, 194; 156/382, 583.1; 425/338, 405.1, 504, 508, DIG. 60

[56] References Cited

U.S. PATENT DOCUMENTS 2,627,289  2/1953  Berthelsen .......................... 100/93 P
2,792,678  5/1957  Baldwin, Jr. et al. ............ 100/194 X
4,857,135  8/1989  Copp .................................. 100/914 X

FOREIGN PATENT DOCUMENTS 59-4429     1/1984  Japan ................................. 425/405.1
62-218126   8/1987  Japan ................................. 156/382
62-275600  11/1987  Japan ................................. 100/93 P
63-251207  10/1988  Japan ................................. 156/382
1-242216    9/1989  Japan ................................. 425/405.1

Primary Examiner—Stephen F. Gerrity
Attorney, Agent, or Firm—Browdy and Neimark

[57] ABSTRACT

A vacuum hot platen press for pressing laminated boards includes a seal cover assembly for keeping the internal process chamber airtight. The seal cover assembly is fixed in an airtight manner to a cylinder plate located below the platens, through which the pressure cylinders extend in an airtight manner. The upper end of the cover assembly is in sliding airtight contact with the tensile strength members of the press. The sliding contact prevents elongation of the tensile members under pressing force, or vacuum forces on the cover assembly, from causing distortion or breakage.

2 Claims, 17 Drawing Sheets

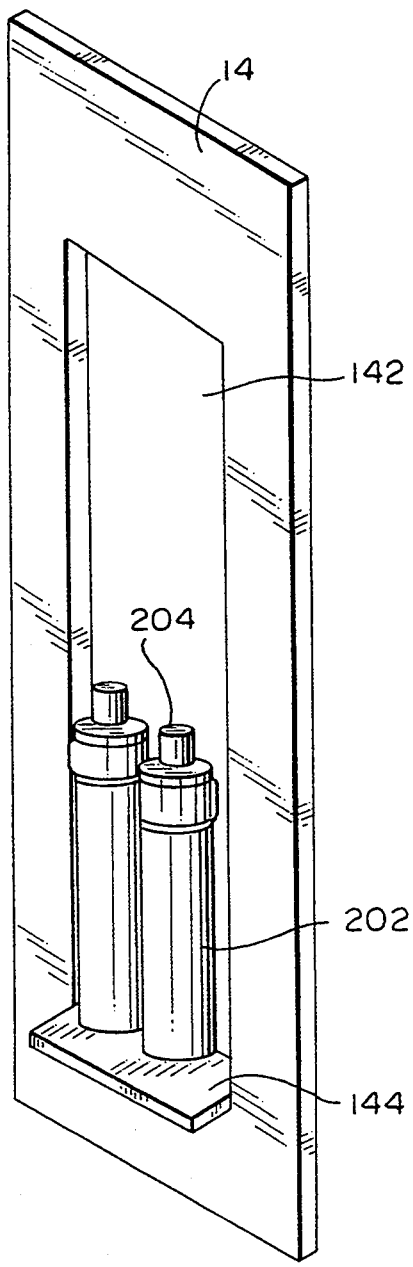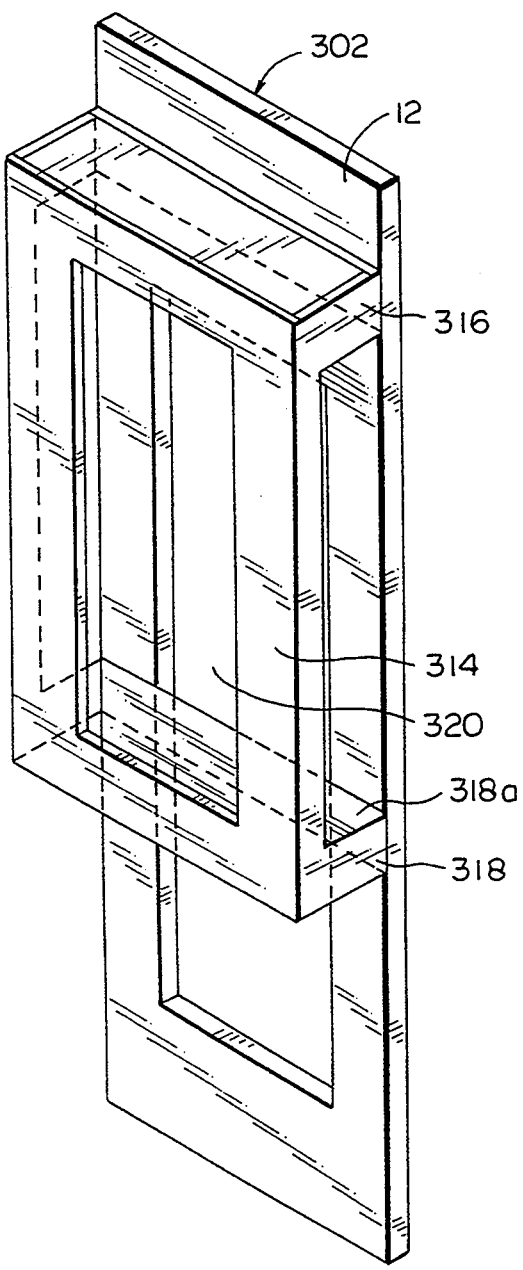

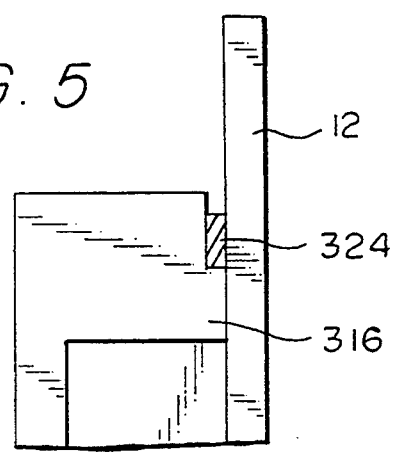
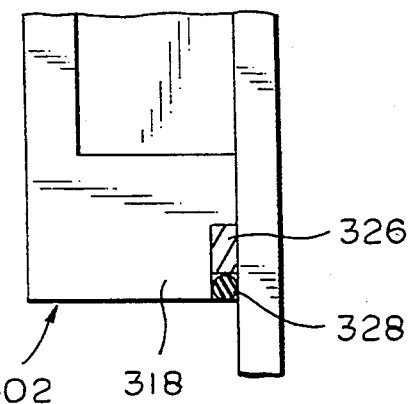
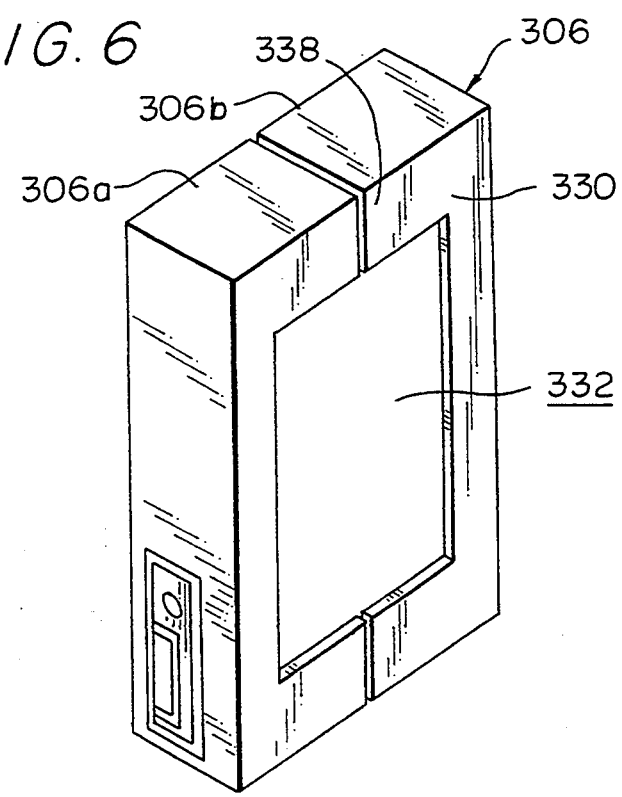

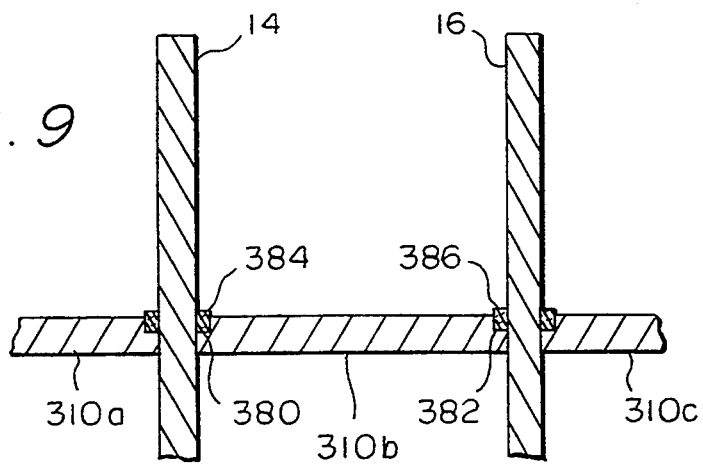
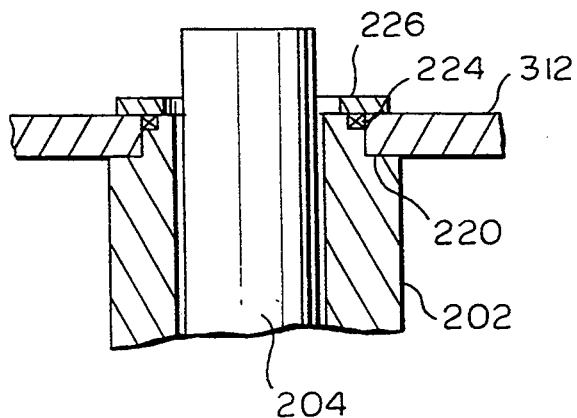
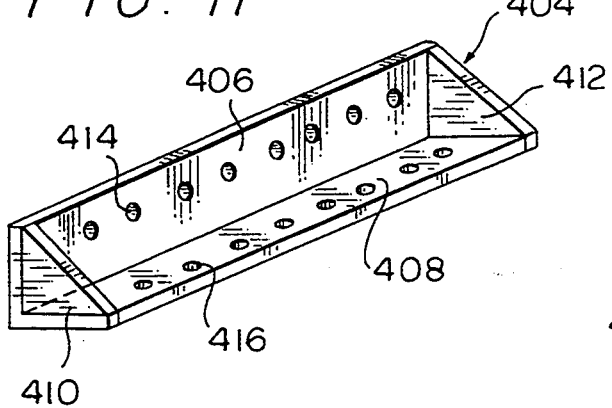
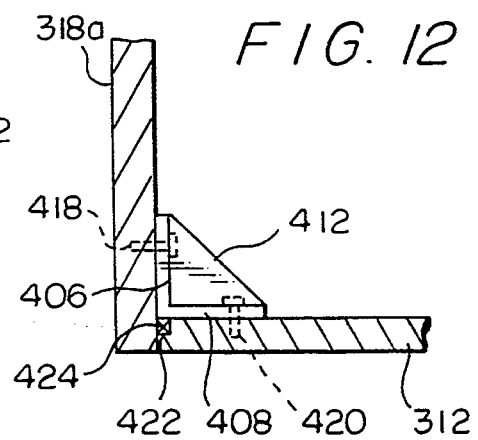

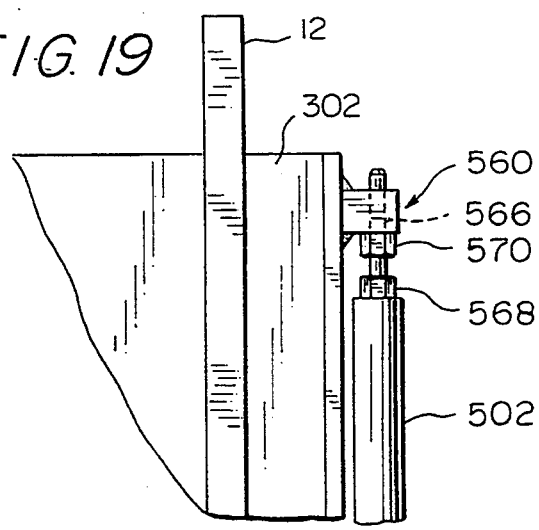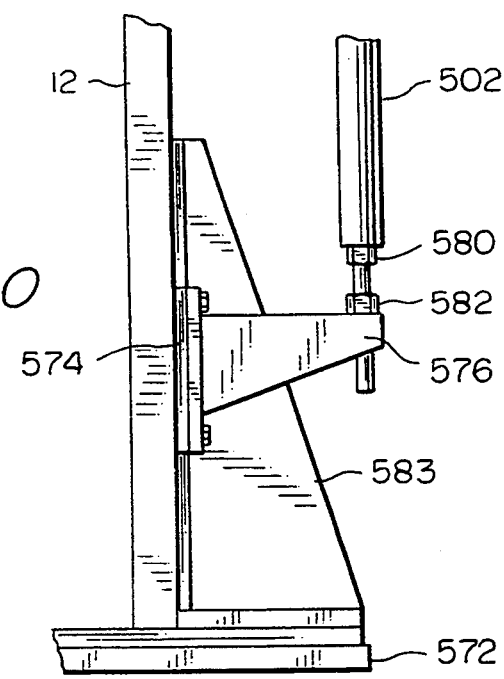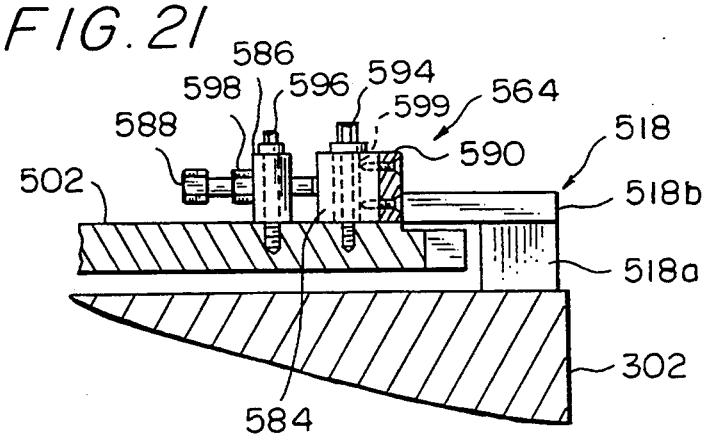

5,410,956

VACUUM HOT PLATEN PRESS WITH AIRTIGHT COVERS IN SLIDING CONTACT WITH TENSILE STRENGTH MEMBERS

BACKGROUND OF THE INVENTION

1. Field of the Invention

The present invention relates generally to hot platen presses and in particular to vacuum hot platen presses suited for manufacturing laminated boards or multi-layered electronic circuit boards.

2. Description of Related Art

There have previously been invented column type and window frame type vacuum hot platen presses. The vacuum hot platen press of a column type fundamentally provides four columns each of whose ends are connected to an upper stationary platen and a flange of a pressing cylinder respectively. A movable platen which moves up and down along the column and a plurality of heating platens are provided between the upper stationary platen and the movable platen.

A window frame of the vacuum hot platen press comprises a plurality of rectangular plates of tensile strength members providing a rectangular opening in which a platen moves against a stationary platen and a plurality of hydraulic cylinders.

Both vacuum hot platen presses of both the column type and window frame type provide process chambers which are enveloped by seal covers to be evacuated by a vacuum source. The upper and lower portions of the seal covers of a large vacuum hot platen press of the column type have hitherto been fixed with respect to an upper stationary platen and a flange of the pressing cylinders, which are held apart by four columns that determine the distance between them. The columns are not able to elongate freely, and during the pressing operation the bolts holding the seal covers may break and/or the columns may distort and this is especially a problem when the platen height exceeds 10 meters. Moreover, the seal covers are depressed by vacuum force likewise causing the bolts to be broken or the columns to be distorted.

Similarly, these effects take place in the large vacuum hot platen presses of the window frame type.

Consequently, such problems cause undesirable effects on the quality of laminated boards or multi-layered electronic circuit boards.

SUMMARY OF THE INVENTION

In light of the above-mentioned problems, a primary object of the invention is to provide an improved vacuum hot platen press which prevents the above mentioned breaking of bolts or deforming of such strength members as window frames or columns. To accomplish this, in a vacuum hot platen press which comprises a plurality of frames or columns (strength members) which stand upright on the base plates of the vacuum hot press, an upper stationary platen which is fixed to the upper end portion of the window frames or columns, at least one pressing cylinder, a movable platen which is connected to an end portion of the ram of the pressing cylinder for lifting the heating platen provided between the upper platen and movable platen, and seal covers which enclose a process chamber of the press, the seal covers are not fixed to the strength members but contact the strength members in an airtight manner so as to allow sliding upon elongation or contraction of the strength members.

BRIEF DESCRIPTION OF THE DRAWINGS

FIG. 3 is a perspective view of two pressing cylinders fixed with an opening of each window frame;

FIG. 4 is a perspective view showing a state in which the front cover is fixed to the frame;

FIG. 5 is a schematic view with a sectional view showing a state of sealing between the front cover and frame by packings;

FIG. 6 is a perspective view of a side cover itself;

FIG. 9 is a fragmentary, sectional view showing a connection between an upper portion of the frames and upper covers;

FIG. 10 is a fragmentary, sectional view showing a state of sealing between the pressing cylinders and a cylinder plate;

FIG. 11 is a perspective view of a complementary part for setting the front seal cover over the cylinder plate;

FIG. 12 is a fragmentary, sectional view showing the front cover connected to the cylinder cover by a complementary member;

FIG. 19 is a schematic view of an upper stopper provided with the shutter;

FIG. 20 is a schematic view of a lower stopper provided with the shutter;

FIG. 21 is a schematic view showing a guide rail assembly for the shutter;

DETAILED DESCRIPTION OF THE PREFERRED EMBODIMENTS

Figure 1:
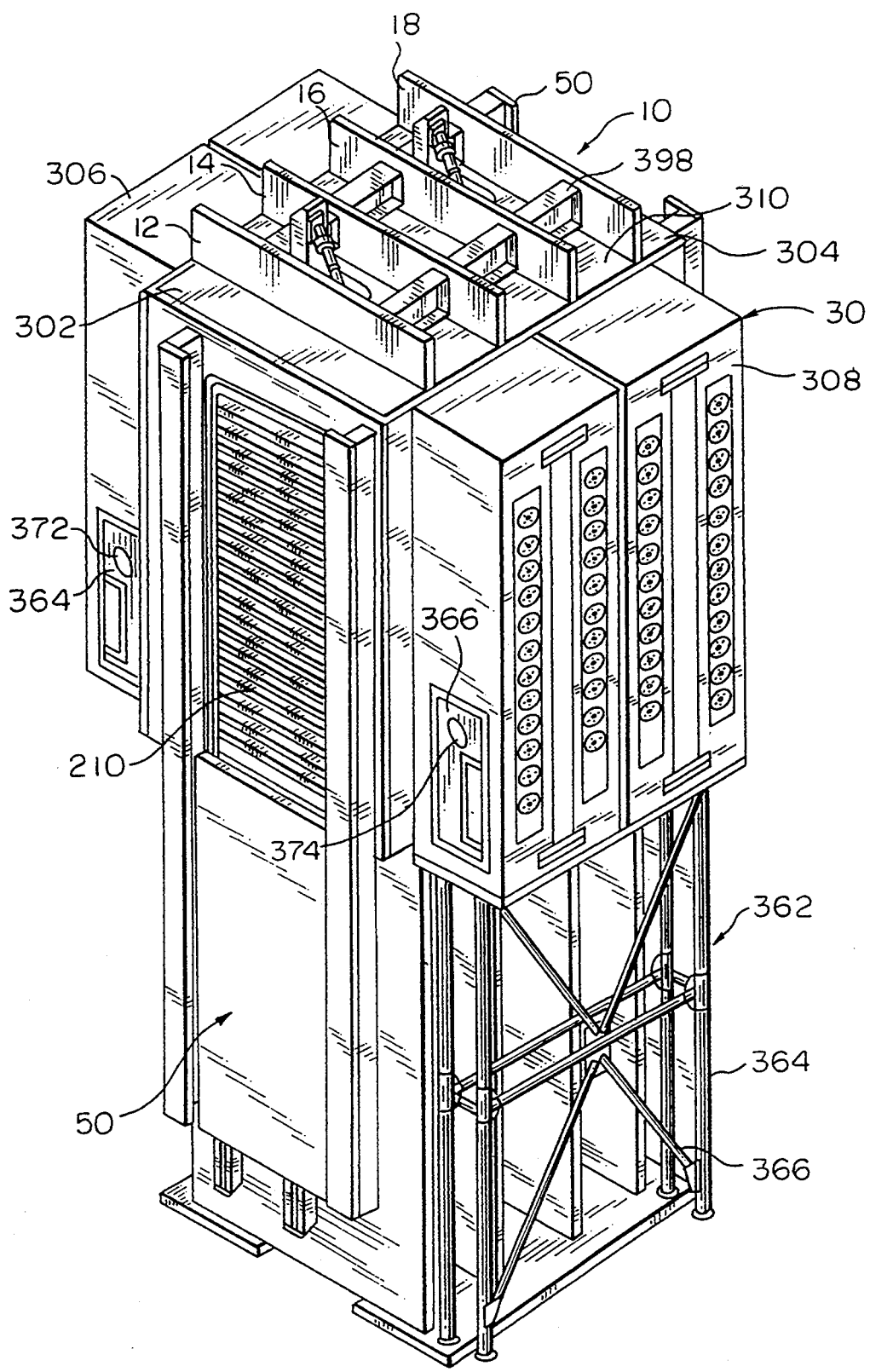
FIG. 1 is a perspective view of a vacuum hot platen press of he invention of the window frame type.

FIG. 1 shows a preferred embodiment of the vacuum hot platen press of window frame type. The vacuum hot platen press 10 comprises four window frames, 12,14,16,18 which stand on base plates 572 (shown in FIG. 20) at regular intervals shown in FIG. 1, a plurality of connecting beams 398 which connect each of window frames 12,14,16,18, respectively, a vacuum cover assembly 30 to keep a process chamber airtight, and as shown in FIG. 2, a pressing apparatus composed of stationary upper platen 208, a movable platen 206, a plurality of pressing cylinders 202 for pressing the laminated boards, a plurality of heating platens 210, and a heating unit to heat or cool the heating platens.

Figure 2:
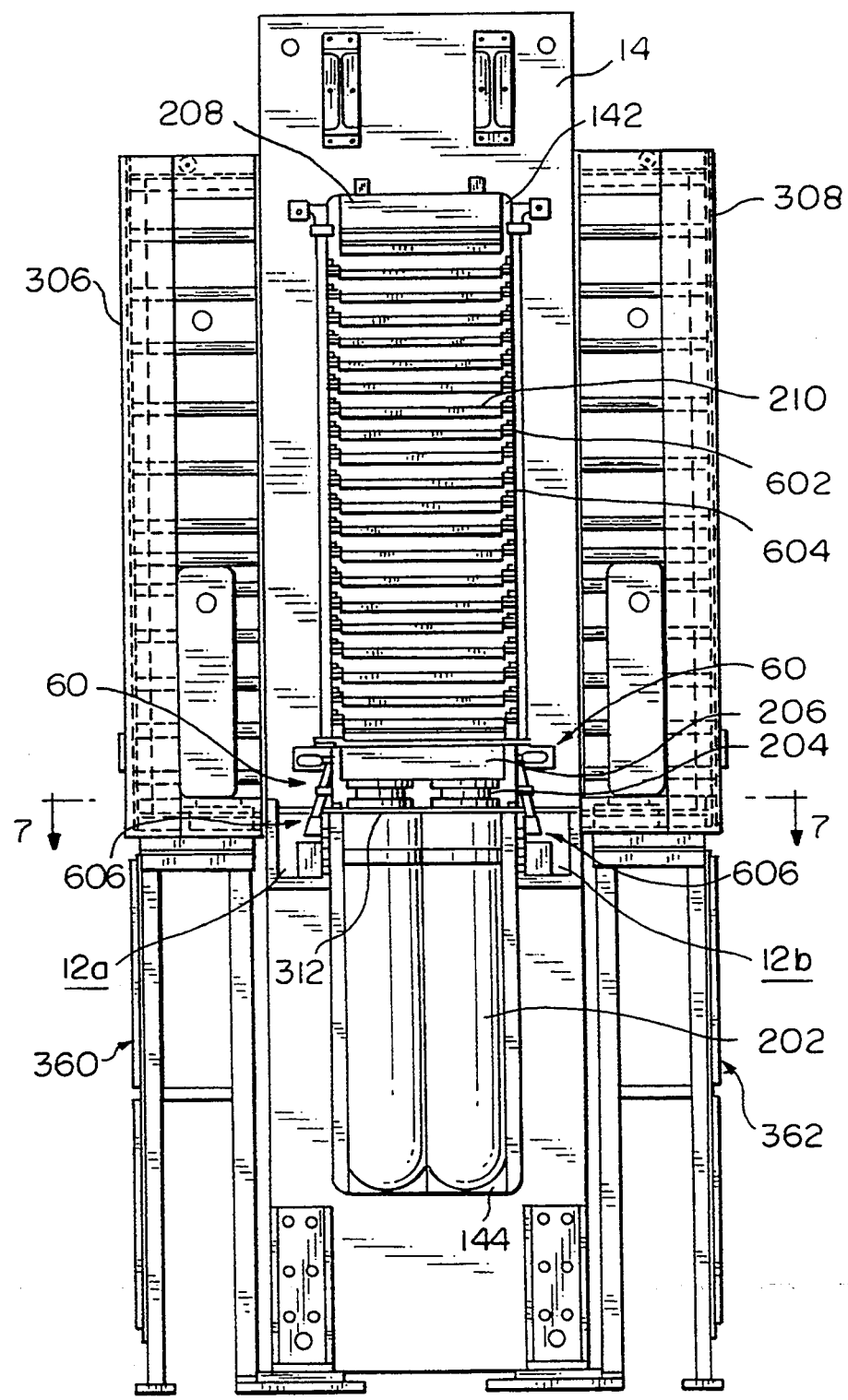
FIG. 2 is a front elevational view of a vacuum hot platen press of the invention, with the front cover shown in FIG. 1 omitted.

Referring to FIGS. 2 and 3, the window frame 14 is a rectangular plate with rectangular opening 142 at the central portion of the window frame 14.

As best shown in FIG. 3, seat plate 144 is fixed to the lower end portion of each opening 142 of four window frames 12,14,16,18.

Two pressing cylinders 202 per window frame are fixed on the seat plate 144 as shown in FIG. 3. The top end of each ram 204 of eight cylinders 202 is fixed to a movable platen 206. An upper stationary platen 208 is fixed on the upper portion of the opening 142 to be positioned face to face with the movable platen 206. There is provided a plurality of connecting bars 398 between the upper portions of each of the window frames 12,14,16,18 so that they may be able to stand against a vacuum force which may otherwise cause the front cover 302 and the rear cover 304 to buckle.

There is provided a plurality of movable heating platens 210 between the upper stationary platen 208 and the movable platen 206. The laminated boards to be treated are placed on the heating platens 210 to be pressed by the pressing force of the pressing cylinders 202.

Referring to FIGS. 1 and 2, the seal cover assembly 30 within which a vacuum can be created comprises a front cover 302, a rear cover 304, two side covers 306,308, an upper cover 310, and a cylinder plate 312.

A front plate 314 positioned in a vertical plane, an upper plate 316 positioned in a horizontal plane and a lower plate 318 with inside plate 318a positioned in a horizontal plane as shown in FIG. 4 constitutes the front cover 302. The front plate 314 provides an opening to either put or remove the laminated boards in a process chamber. Also, the rear cover 304 has the same construction as front cover 302.

As shown in FIG. 5, seal packing 324 and 326 are provided between the window frame 12, the upper plate 316, and the lower plate 318 of the front cover 302. A seal packing 328 having circular cross section is used for repair when sealing of the seal packing 326 or 324 becomes imperfect.

Figure 7:
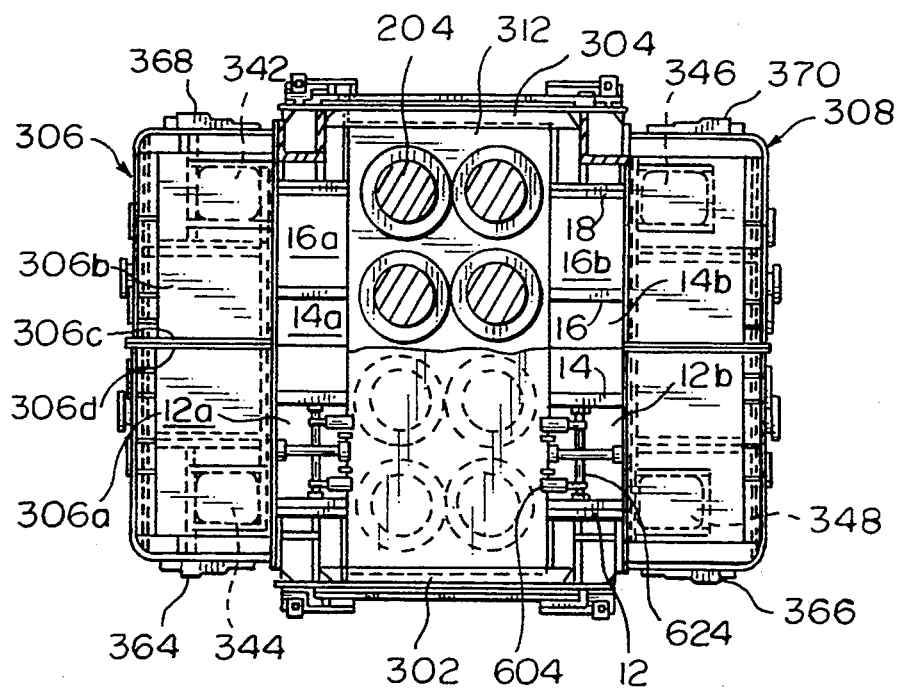
FIG. 7 is a fragmentary, sectional view along line 7—7 in FIG. 2.

The side covers 306,308, the front cover 302, and the rear cover 304 constitute a parallelepiped as shown in FIGS. 1 and 2, respectively. As shown in FIG. 7, the side cover 306 is divided into two equal parts 306a,306b which are connected at the portion of flanges 306c,306d. The side cover 308 is also divided in the same way as the side cover 306. As shown in FIG. 6, the side covers 306,308 have the same height as the front cover 302 and each side plate 330 of the side covers 306,308 has openings 332. The front cover 302 and the rear cover 304 are fixed in an airtight manner on the cylinder plate 312.

The cylinder plate 312 provides eight holes into which small outer diameter portions at each upper portion of eight pressing cylinders 202 are inserted. The eight holes on the cylinder plate 312 act to force the eight pressing cylinders to arrange themselves in the correct positions. As shown in FIG. 10, the cylinder plate 312 is fixed in an airtight manner on each indentation step 220 of the pressing cylinders 202 with a seal packing 224. A washer or flange 226 is fixed to the cylinder plate 312 by bolts for preventing seal packing 224 from being sucked up by the vacuum force.

As shown in FIGS. 11 and 12, the inside lower plate 318a of the front cover 302 is fixed to the front end portion of the cylinder plate 312 with a rectangle bracket 404 by a vertical flange 406 with penetrated holes 414 which are fixed to the inside lower plate 318a of the front cover 302 by bolts 418. A horizontal plane 408 with penetrated holes 416 is fixed to the front end portion of the cylinder plate 312 by bolts 420. The vertical plane 406 is connected to the horizontal plane 408 at both end portions with triangle brackets 410,412. A seal packing 424 is provided in an indentation step part 422 along the surface which the inside lower plate 318a of the front cover 302 contacts the front end surface of the cylinder plate 312.

Figure 13:
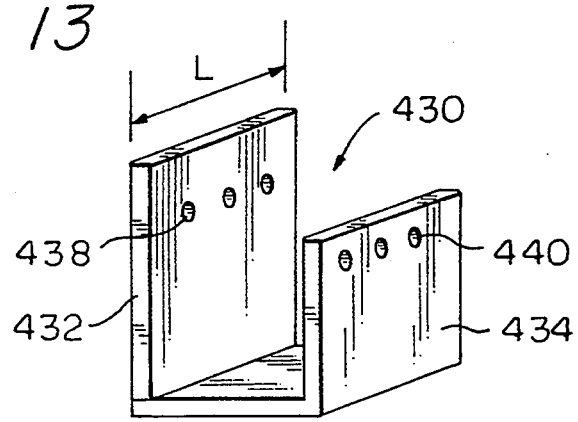
FIG. 13 is a perspective view of the connecting bracket.
Figure 14:
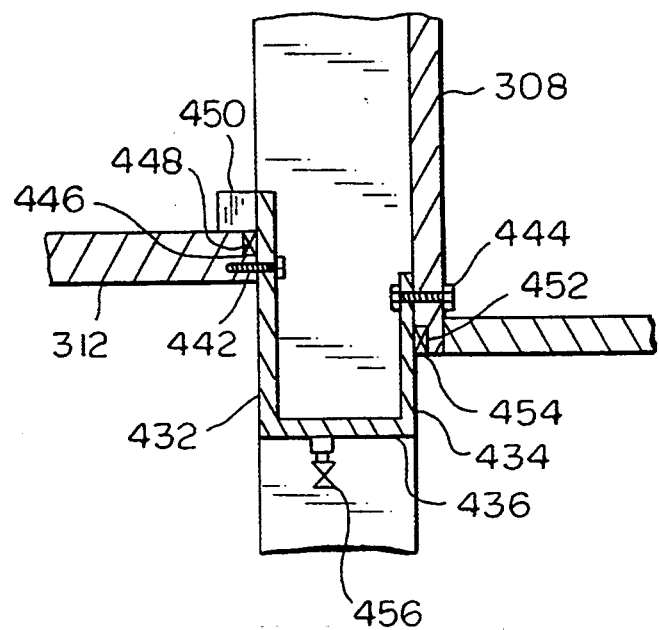
FIG. 14 is a fragmentary and sectional view showing a state to which the connecting bracket is set.

Referring to FIGS. 13 and 14, the side covers 306,308 are connected in an airtight manner to the cylinder plate 312 by connecting brackets 430. As shown in FIG. 7, the connection brackets 430 are used for sealing in an airtight manner each of spaces 12a,14a,16a,12b,14b,16b which are formed with the cylinder plate 312, side covers 306,308 and window frames 12,14,16,18. A vertical portion 432 of the connection brackets 430, with holes 438 are joined to the end portion of the cylinder plate 312 by bolts 442. Another vertical portion 434 with holes 440 is connected to the side cover 308 by bolts 444. The connecting brackets 430 provided between each of the window frames 12,14,16,18 are not only used for sealing means but also for reinforcement against vacuum force acting on front cover 302 and the rear cover 304 in the same manner as connecting bars 398. There is provided an indentation step portion 446 on the end portion of cylinder plate 312 for fitting a seal packing 448 which is held by a lid 450 and similarly an indentation step portion 452 on the end portion of the side cover 308 for fitting a seal packing 454.

A drain cock 456 is provided on a horizontal portion 436 of the connecting brackets 430.

The side covers 306,308 are connected in an airtight manner to both the side plates of the front cover 302 and the rear cover 304. Inside side plate 330 of the side cover 306 is connected in an airtight manner to a side upper portion 316 and a side downward portion 318 of the front cover 302 and to the rear cover 304 in a similar manner. An inside plate of the side cover 308 is also connected in a similar fashion to the front cover 302 and rear cover 304. Opening 332 is provided in inside plate 330 of the side cover 306 as shown in FIG. 6. The side covers 306,308 are connected to the front cover 302. Support members 360,362 are provided for auxiliary support of the side covers 306,308. As shown in FIG. 7, four openings 342,344,346,348 are provided for maintenance work from the bottom of the side covers 306,308. These openings are usually closed in an airtight manner except during maintenance. Doors 364,366,368,370 are provided on both sides of the side covers 306,308 as shown in FIGS. 1 and 7. As shown in FIG. 1, these doors which are provided with windows 372,374 serve as an entrance for workers.

Figure 8:
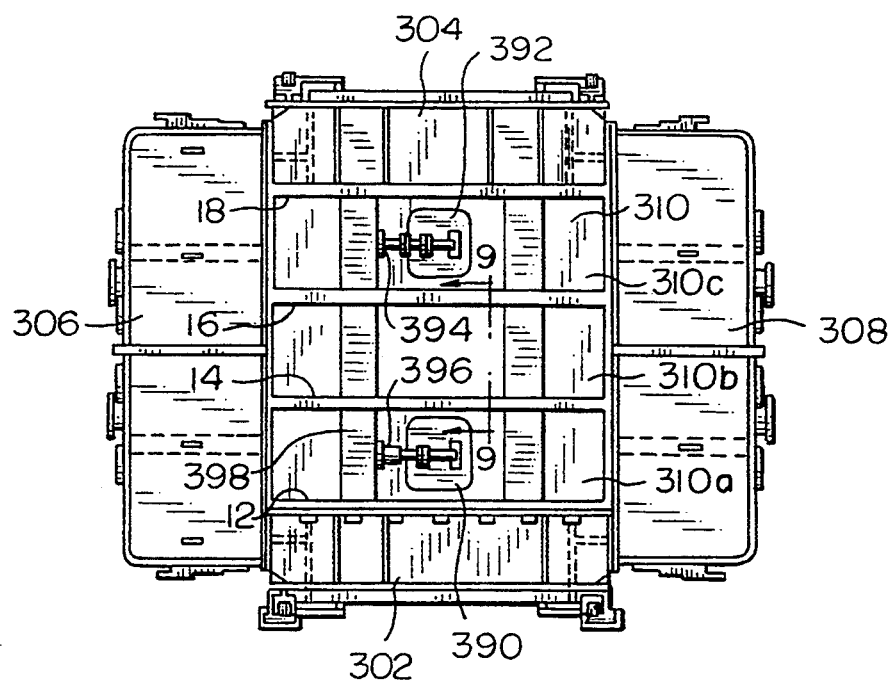
FIG. 8 is a top view of the hot platen press.

Referring to FIG. 8, the upper covers 310 which seal in an airtight manner an upper portion of the hot platen press are constituted with three rectangular plates 310a,310b,310c.

The longer sides of the rectangular plates 310a,310b,310c contact in an airtight manner the side surface of the window frames 12,14,16,18 to permit sliding. The shorter sides of 310a,310b and 310c engage the upper portion 338 of the inner side surface 330 of the side covers 306,308. Referring to FIG. 9, indentation step portions 380 and 382 are formed in the longer sides of the rectangular plate 310b for sealing material 384,386 to be fitted.

Both end portions of the shorter sides of the rectangular plates 310a,310b,310c are connected in an airtight manner to the side covers 306,308 with bolts. Thus, the longer side surface of the upper covers 310a,310b,310c are able to slide in an airtight manner with the surfaces of the window frames 12,14,16,18.

Referring to FIG. 8, exhaust ports are provided on rectangular plates 310a and 310c to exhaust exceedingly hot air in the process chamber of the vacuum hot platen press 10. As shown in FIG. 8, the respective exhaust ports are opened or closed by lids 390,392 operated with pneumatic actuators 394,396.

Figure 15:
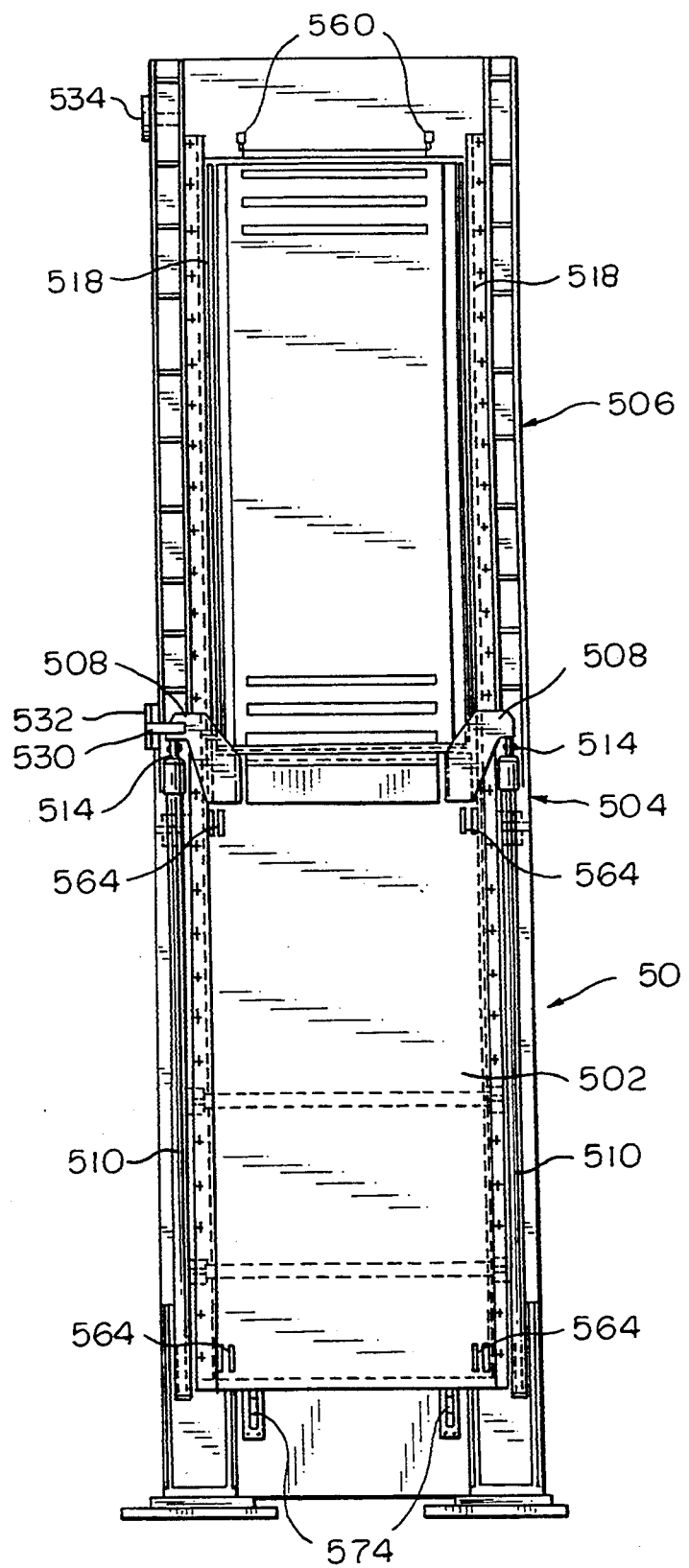
FIG. 15 is a front elevational view showing a state in which the shutter is provided in the front of the front cover and has descended to the bottom end of the front cover.

Referring to FIGS. 1 and 15, it will be seen that a shutter assembly 50 is provided to open or close in an airtight manner the opening 320 of the front cover 302. The shutter assembly 50 comprises a shutter 502, two hydraulic cylinders 510 for operation of the shutter 502 and guide bars 506 to define trackways of the shutter 502.

Figure 16:
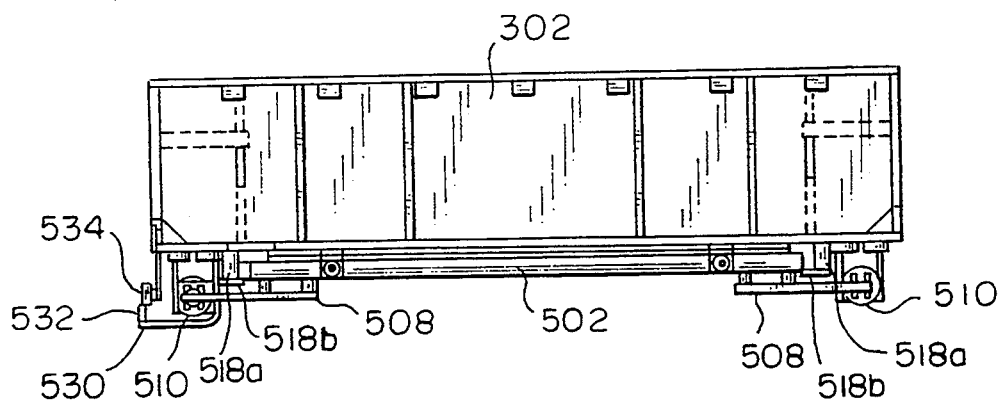
FIG. 16 is a top view of the shutter assembly.

The hydraulic cylinders 510 are fixed symmetrically on the front lower portion of the front cover 302. The shutter 502 is set so that it can move along the guide bars 506 which are fixed on both sides of front cover 302. End portion rods 514 of hydraulic cylinders 510 are joined respectively to each bracket 508 fixed to the portions protruding from the upper symmetrical portions of the front cover 302. A pair of guide rails 518 which define the trackway of the shutter 502 are fixed on both sides of opening 320 of front cover 302. As shown in FIG. 16, the guide rails 518 are made up of a side guide rail 518a and a front guide rail 518b.

Referring to FIG. 19, it will be seen that there is an upper limit to which the shutter 502 ascends to a pair of upper stoppers 560. Each stopper 560 has a through hole 566 and is fixed on the upper portion of the front cover 302. A pair of adjusting bolts 568 which are fixed to the upper portion of the shutter 502 and have a shaft corresponding to through holes 566. Locking nuts 570 are threadedly secured to the adjusting bolts 568. Consequently, an upper limit position to which the shutter 502 ascends, is can be defined by adjusting locking nut 570 on bolts 568.

Figure 17:
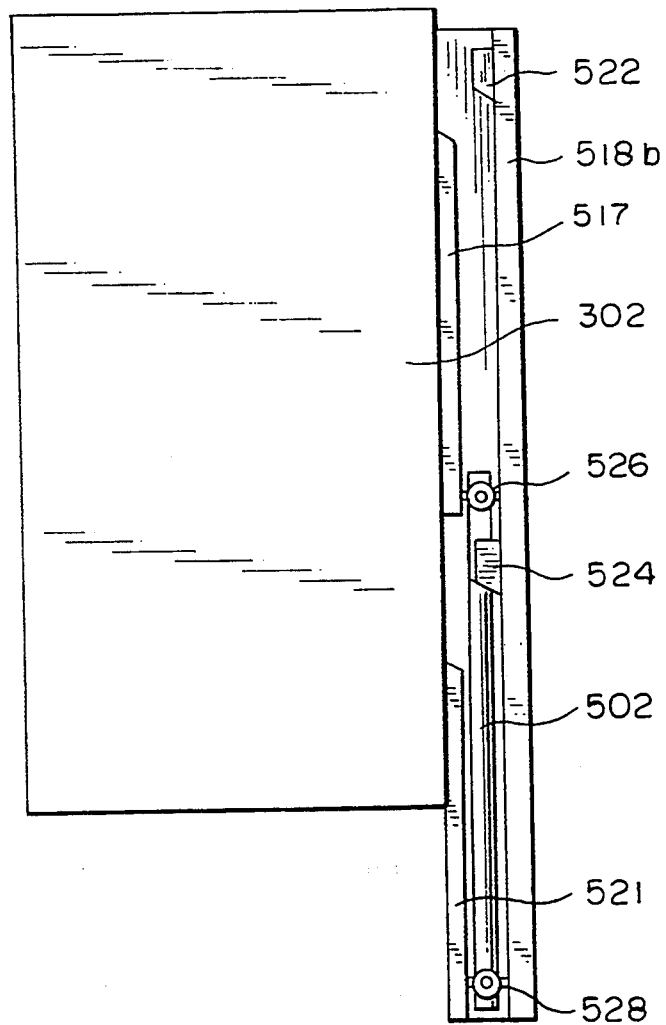
FIG. 17 illustrates an operating state of the shutter assembly.
Figure 18:
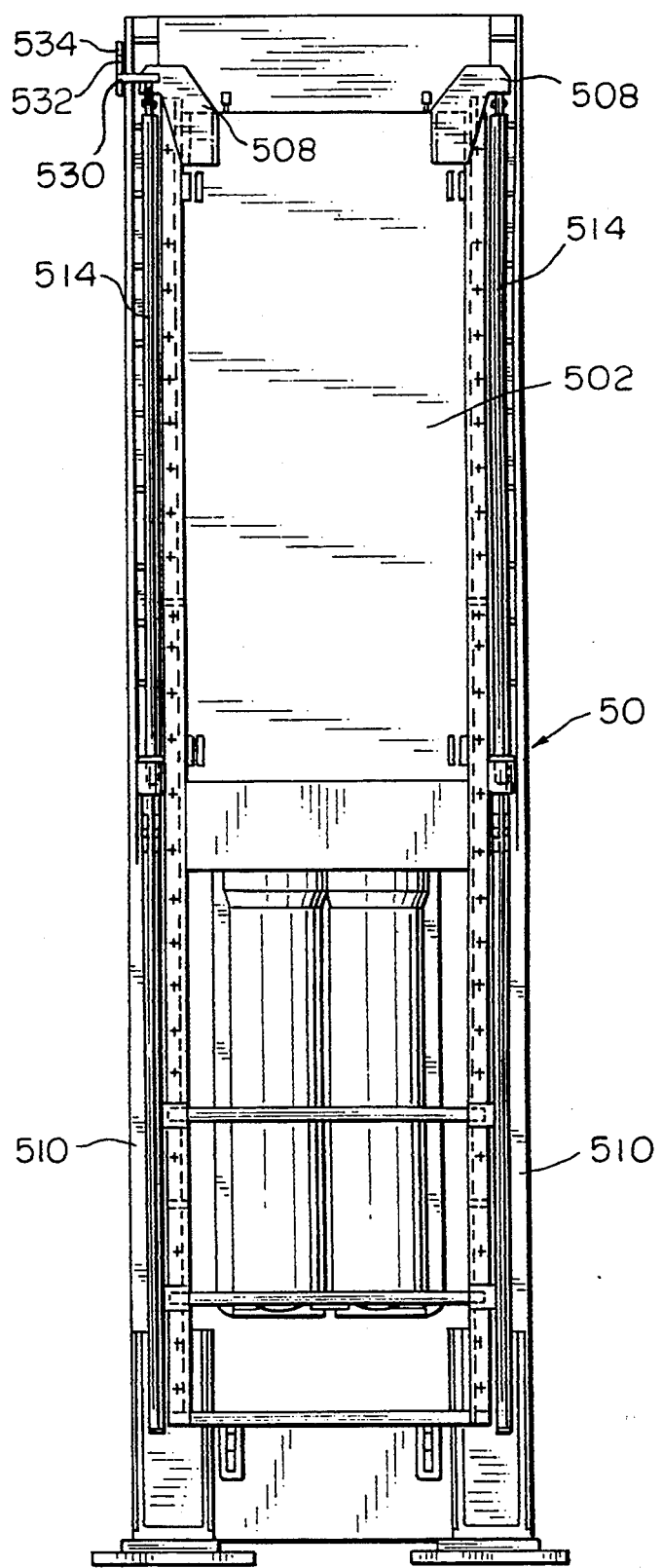
FIG. 18 is a front elevational view showing a state in which the shutter has elevated to the top end of the front cover.

Referring to FIG. 20, it will be seen that there is a lower limit position to which the shutter 502 descends. A pair of spacers 574 is fixed on the lower portion of the front surface of the frame 12. A pair of lower stoppers 576 is fixed on respective spacers 574, in which a pair of adjusting bolts 580 are secured. Two locking nuts 582 are threadedly secured to the adjusting bolts 580. Consequently, a lower limit position to which the shutter 502 descends is defined by adjusting the locking nut 582 on bolts As shown in FIG. 17, a cam follower roller 526 is provided with both sides of the upper portion of shutter 502. Another cam follower roller 528 is provided with both sides of the shutter 502 spaced apart from follower rollers 526. A pair of cams 517 and 521 are fixed on both sides of the opening 320 of the front cover 302 at a decided interval a in straight line. A pair of cams 522 and 524 are fixed with a pair of front guide rails 518b at opposite sides at positions in which the cams 517 and 521 are not placed. As shown in FIG. 18, left side bracket 508 is fixed to the upper left side portion of the shutter 502, and a cam 532 for a limit switch 534 is fixed to a plate 530 which is fixed to the left side bracket 508. The limit switch 534 is fixed on the front cover 302 so that it can contact the cam 532 at the upper ascending limit position of the shutter 502 as shown in FIG. 18.

FIG. 21 shows one of two pairs of shutter guide devices 564. Shutter guide device 564 on both sides of the upper and lower portions of the shutter 502 as shown in FIGS. 15 and 18 to prevent the inclination of the shutter 502 in a lateral direction. A resin plate 590 fixed to a first bar 584 by a plurality of bolts 594 through each elongated through hole 599 permits shutter 502 to slide relative to cover 302 in contact with the side face of the front guide rail 518b. A second bar 586 is fixed by a plurality of bolts 596 on the shutter 502 at a short distance from the first bar 584. A plurality of adjusting bolts 588 with threaded locking nuts 598 are provided with the second bar 586 in order to adjust the contact of rail 518b with the first bar 584.

Figure 22:
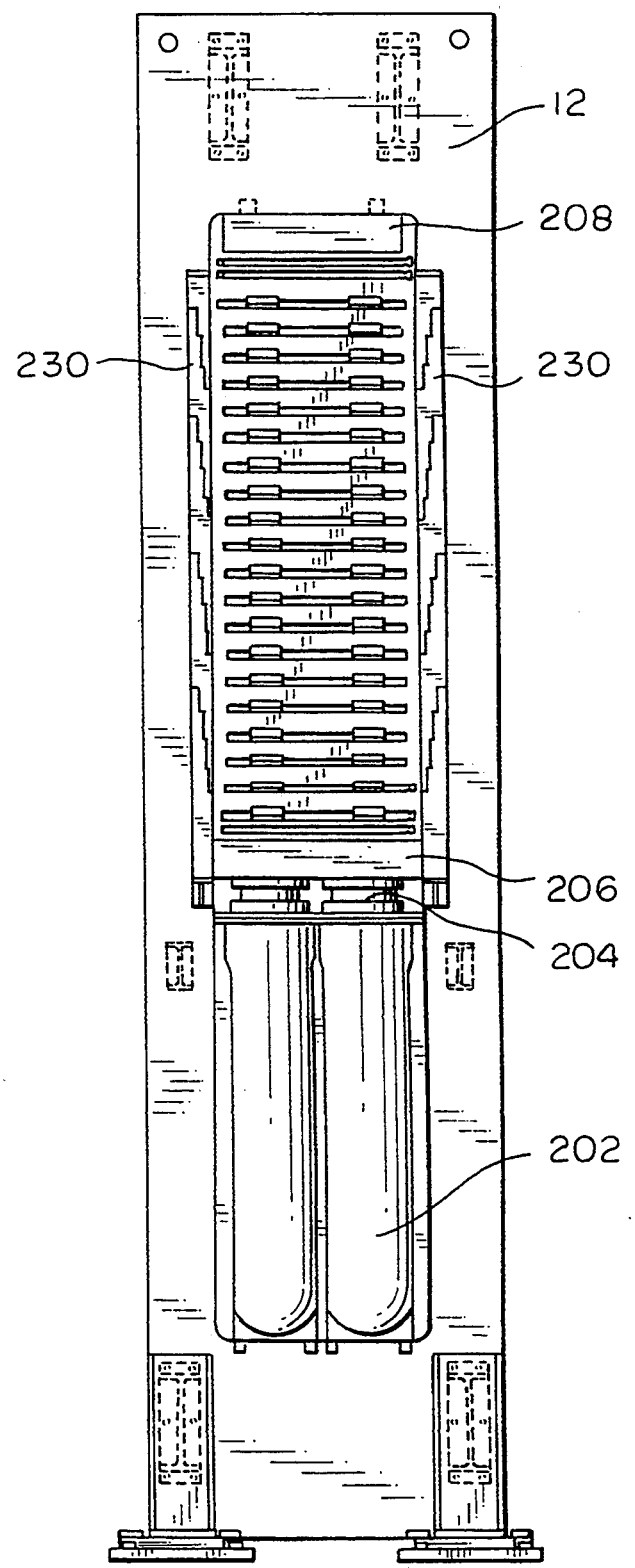
FIG. 22 is a front elevational view of the entire vacuum hot press except for a front cover with the shutter assembly and the side cover.
Figure 23:
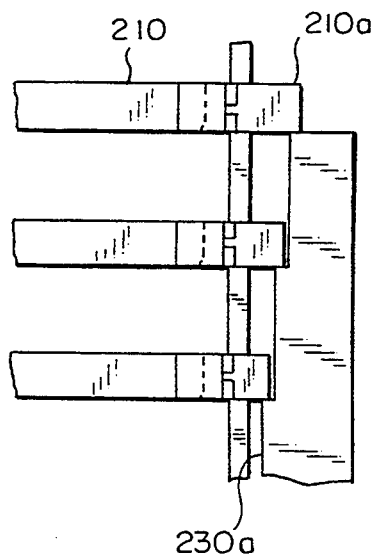
FIG. 23 is a fragmentary, sectional view as seen from FIG. 22.

FIGS. 22 and 23 show support means for supporting the heating platens. A supporting plate 230 with a plurality of step portions 230a is provided at four corners in the vacuum hot platen press. When the rams 204 of the pressing cylinders 202 have descended, supporting brackets 210a provided with four corners of the heating platens 210 are supported on the step portion of the supporting plates 230 to keep a daylight opening between the heating platens 210. The laminate boards between the heating platens 210 are pressed by the ascending of the rams 204 of the pressing cylinders 201.

Figure 24:
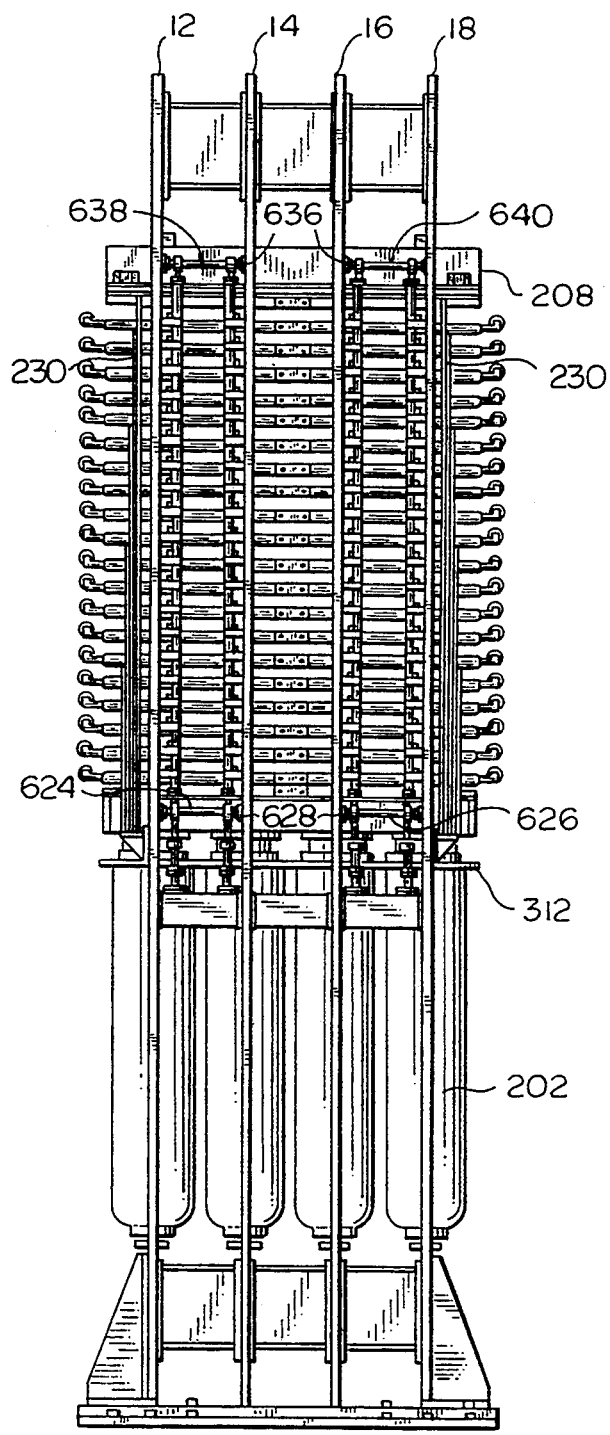
FIG. 24 is a side elevational view of the vacuum hot press except for a front cover with the shutter assembly and the side cover.
Figure 25:
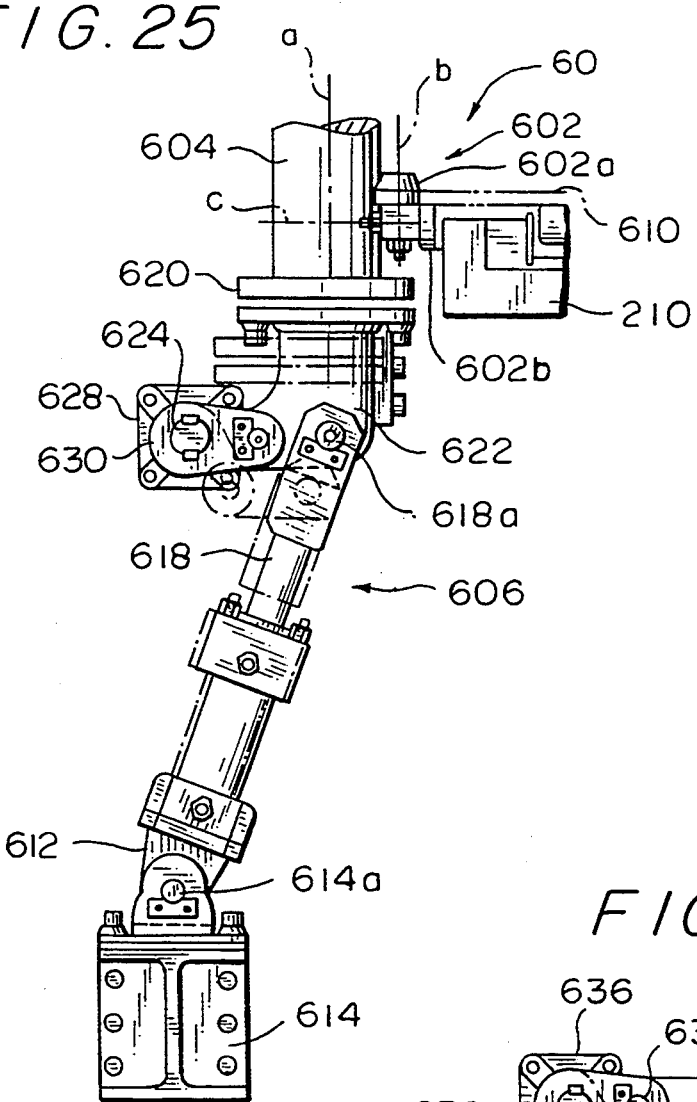
FIG. 25 is a front elevational view showing a lifting device for carrier plates.

FIGS. 2, 15, 25 and 26 show a lifting device 60 with carrier plates 610 which are provided to prevent the surface of the heating platens 210 from being scratched by the surface of carrier plates 610 when they are on the heating platens 210. The pillars 604 constitute the lifting device and are provided respectively adjacent to both sides of the heating platens 210. A plurality of roller pairs 602 (602a,602b) are provided with respective pillars 604 along with hydraulic cylinders 606 for an up and down motion of the pillars 604. As shown in FIG. 25, lower brackets 612 of the hydraulic cylinders 606 are linked so that they may swing freely on the pivot 614a which is provided with brackets 614. Each bracket 614 is mounted on each connecting bracket 630. An end portion of the rod 618 of the hydraulic cylinder 606 is linked so that they may swing freely to a right portion (FIG. 24) of a lower L-shaped bracket 622 fixed to the bottom of flange 620 of pillar 604. A left portion of the lower L-shaped bracket 622 is linked to an end portion of link 630. Another portion of this link is linked on a shaft 624 which is supported through a pair of bearings 628 between the window frame 12 and 14, and on a shaft 626 supported through a pair of bearings 628 between the window frame 16 and 18 as shown in FIGS. 7 and 25.

Figure 26:
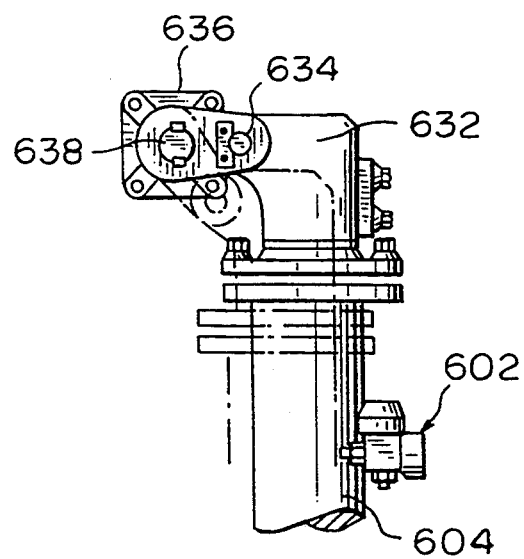
FIG. 26 is a front elevational view showing an upper supporter of a lifting device of the carrier plates.

As shown in FIG. 26, the top portion of the pillar 604 is fixed to an upper L-shaped bracket 632. A left portion of the upper L-shaped bracket 632 is linked to the right portion of link 634. The left portion of the link 634 is linked so that it may swing freely on the shaft 638 which is supported through bearings 636 (640) which are fixed to the window frame 12 and 14 and window frame 16 and 18, respectively.

The pairs of rollers 602 are provided on each pillar 604 as much as the numbers of the heating platens 210.

The guiding roller 602a is rotatable around the axis b of a shaft which is fixed on each pillar 604. The lifting roller 602b is rotatable around the axis c of a shaft which is fixed on each pillar 604.

Axis b which parallels axis a of pillar 604 is perpendicular to axis c of the shaft. The rollers for 602b are used for lifting and conveying the carrier plates 610. Guiding rollers 602a are used to prevent lateral movement of boards when they are being conveyed.

Figure 27:
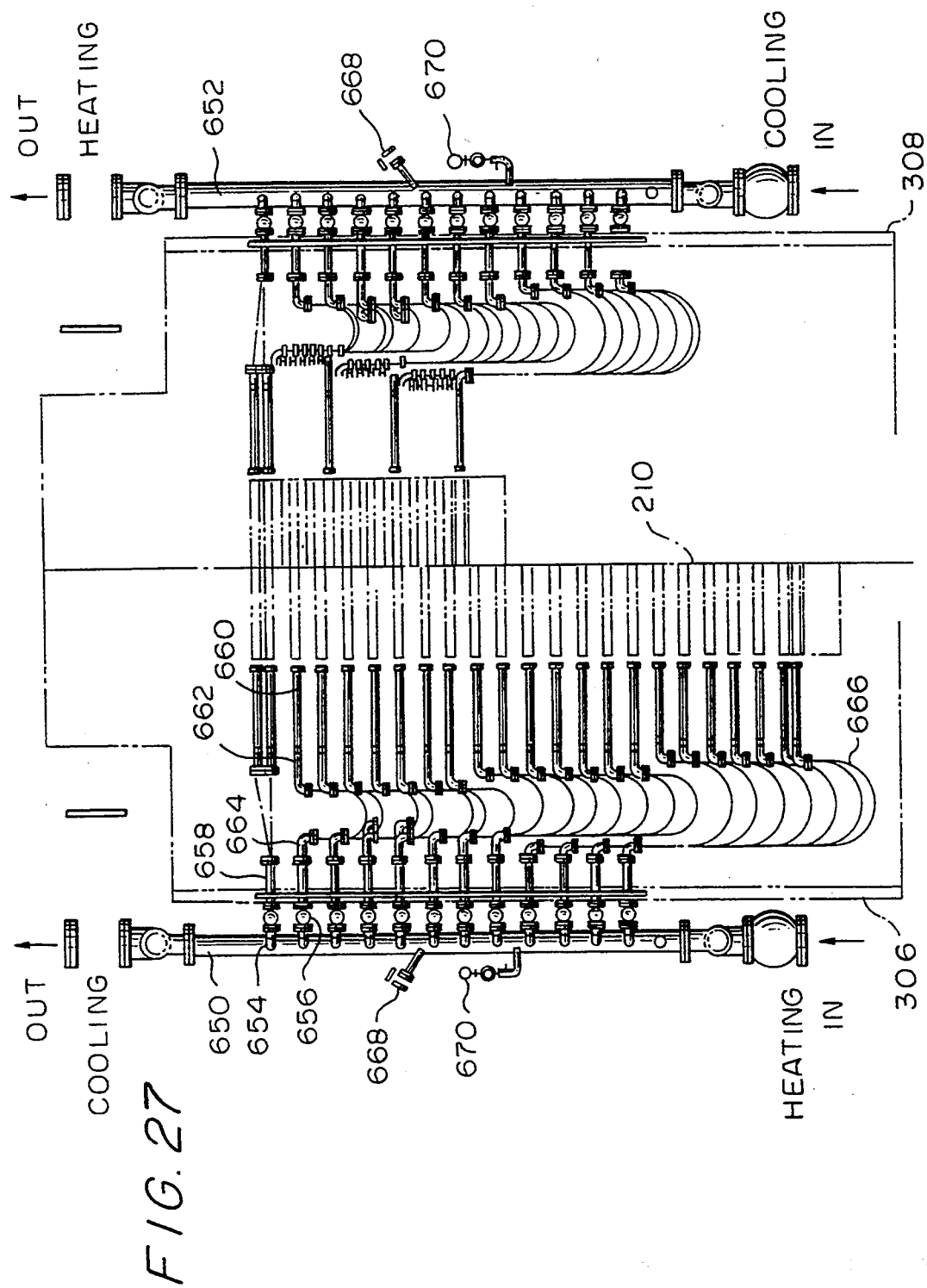
FIG. 27 is a front elevational view showing a heating unit of the heating plates.
Figure 28:
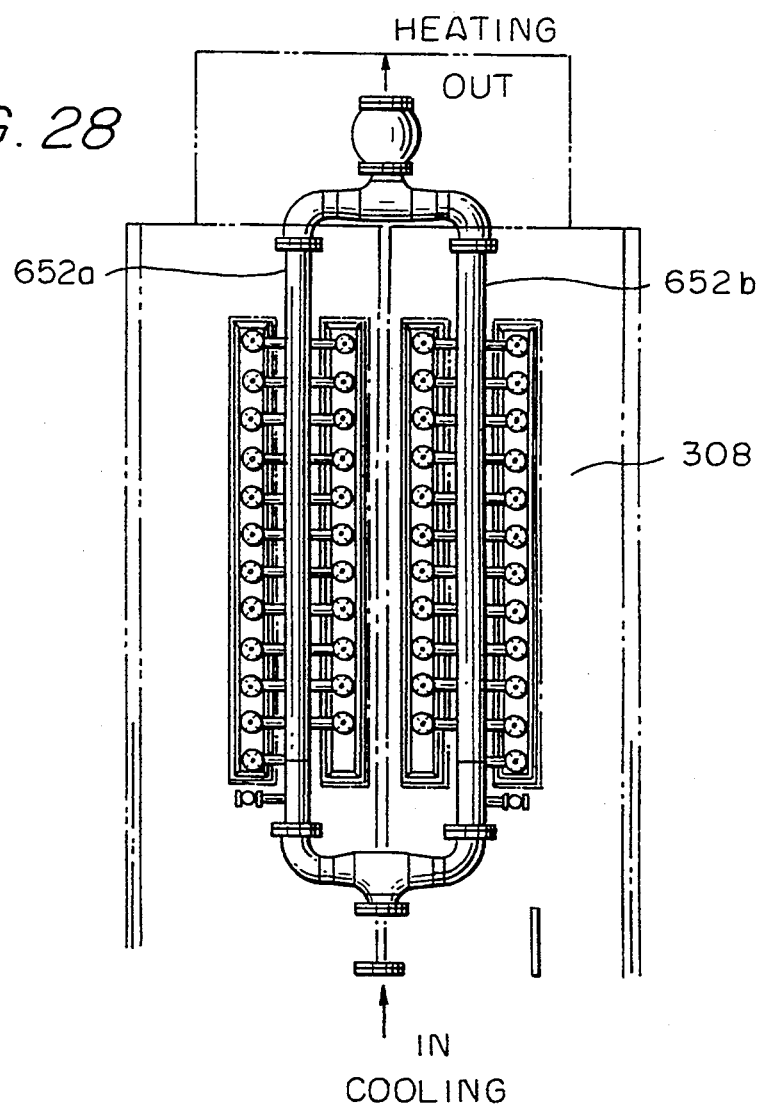
FIG. 28 is a side schematic view showing the heating unit.

FIGS. 27 and 28 represent a heating unit of platens 210. Manifold pipes 650,652 which supply heated fluid to the heating platens 210 are provided with the side of side cover 306,308. The pipes 652a,652b branch off the manifold pipe 652 as shown in FIG. 28 and the manifold pipe 650 has the same branching pipe as manifold pipe 652.

Outlet pipe 654 is provided with pipes 652a and 652b. Each IN port of valves 656 is connected to its respective pipe 658 with elbow 664 which passes through a plate provided with the airtight side cover 308. The pipes 660 with elbows 662 are connected to both sides of the heating platens 210. Each end portion of the flexible tubes 666 are connected to the elbows 662 and 664. There is a thermocouple 668 and a pressure gauge 670 with each manifold pipe 650,652.

Heating fluid is supplied to the lower part of the manifold pipe 652 so that it may flow through the heating platens 210 and be exhausted from the upper part of the manifold pipe 652 during the heating operation. Cooling fluid is supplied to the lower part of the manifold pipe 652 that it may flow through the heating platens 210 and be exhausted from the upper part of the manifold pipe 650 during cooling operation.

During the operation of the vacuum hot platen press, the shutter 502 descends to its lower limit to open the opening 320 of the front cover 302. Each of the heating plates 210 is put on each of the step portions 230a of the supporting plates 230 to permit a predetermined amount of daylight. The carrier plates 610 which load laminated boards are put onto the rollers 602b of the lifting device 60 by which the pillars 604 are lifted by the ascending of rods 618 due to the actuating of the hydraulic cylinders 606 as shown by the solid lines in FIG. 24. When the carrier plates 610 are conveyed to the predetermined position, the rods 618 descend as shown with dotted lines in FIG. 24 to put the carrier plates 610 on the heating platens 210. After the carrier plates 610 have been put on the heating platens 210, the ascension of the shutter 502 begins. When the shutter 502 reaches the upper limit, the cam follower rollers 526,528 with the shutter 502 come off a pair of the cams 517 and 521 so that the shutter 502 closes the opening 320 of the front cover 302 in an airtight manner so as to lean the front cover 302 because of the eccentricity between the center of gravity of the shutter 502 and the supporting center of the hydraulic cylinder 510 This whole process actuates the shutter 502. After air in the process chamber of the vacuum hot platen press 10 has been evacuated to a predetermined level with vacuum pump means, the eight pressing cylinders 202 are actuated to press the laminated boards between the heating platens 210 which are heated by the heated fluid. After completion of heating and pressing of the laminated boards, cooling of the laminated boards is started by flowing of the cooling fluid in the heating platens 210. The laminated boards which have been treated are conveyed out the process chamber with operation of the lifting device 60 after descending of the shutter 502.

Figure 29:
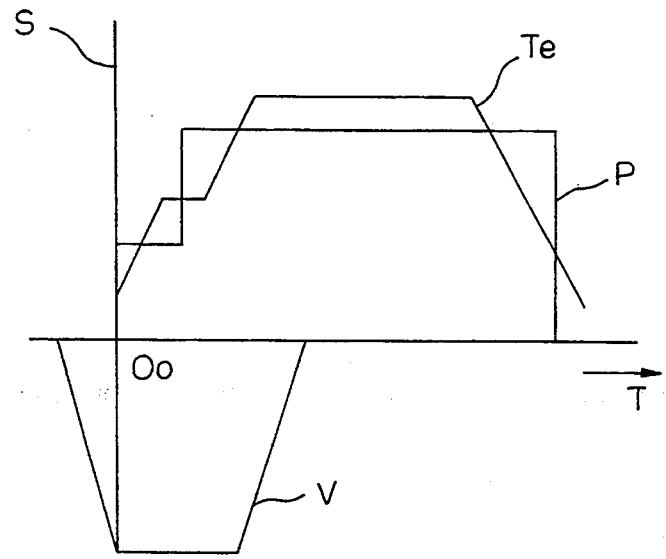
FIG. 29 is a graph showing variations of temperature and pressure on laminate boards during operation of the vacuum hot platen press.

The graph of FIG. 29 shows variations of degree of Vacuum (V) Temperature (Te) and Pressure acted on the laminated boards (P) corresponding to Time of proceeding of pressing.

Figure 30:
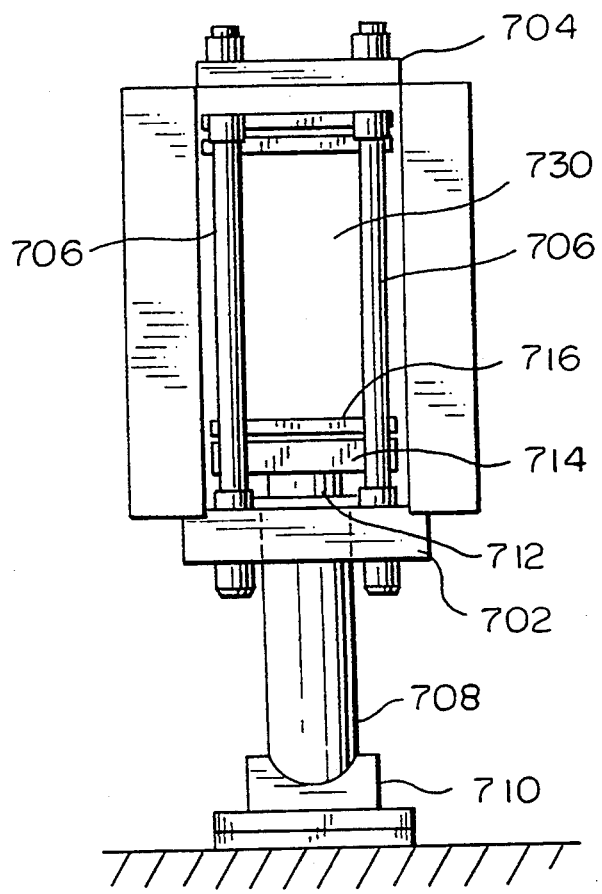
FIG. 30 is a front elevational view showing other embodiments for which this invention is applied.
Figure 31:
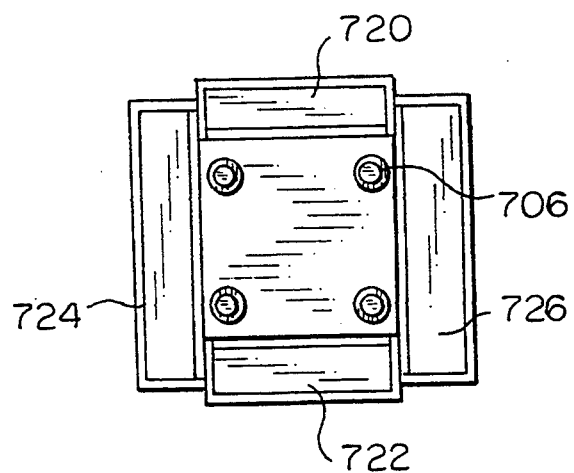
FIG. 31 is a top view of a vacuum hot platen press of the stay type.

FIGS. 30 and 31 show a vacuum hot platen press of a column type which is the other embodiment of the invention.

A pressing cylinder 708 with a flange portion 702 is fixed on a base plate 710. Four columns 706 stand on four corners of the flange portion 702 of the pressing cylinder 708 uprightly, i.e., each lower end portions of the columns 706 are fixed to four corners of the flange portion 702 and each upper end portions of them are fixed to four corners of an upper platen 704. A movable platen 714 which is connected to the end portion of a Ram 712 is provided moveably along the columns 706. As shown in Fig° 30 one of a plurality of heating platens 716 is shown provided between the upper platen 704 and the movable platen 714. A front cover 720, a rear cover 722 and two side covers 724,726 which form a process chamber 730, are mounted on the flange portion 702 fixedly and each upper portions of them are supported to the sides of the upper platen 704 slidably and in an airtight manner.

It is to be understood in the foregoing description that reaction force of the pressing force which presses the laminated boards on each heating platens 210, acts on the upper and lower portions of the openings 142 of each window frame 12,14,16,18 or columns 706 to make the window frames elongate in length. However, as the covers which constitute the process chamber of the invention are not fixed to the window frames or columns which are strength members of a hot platen press but contact them in an airtight manner constituting that the covers are fixed on the cylinder plate 312 or the flange portion 702 which is not affected by displacement of the strength members the vacuum hot platen press of the invention can keep the process chamber airtight in spite of elongation of the strength members.

While the invention has been described by reference to a preferred embodiment chosen for purposes of illustration, it should be understood that numerous changes could be made in the described features without departing from the spirit and scope of the inventive concepts disclosed. Accordingly, it is intended that the invention not be limited to the feature of the disclosed embodiment but that it have the full scope permitted by the language of the following claims.

What is claimed is:

1. A vacuum hot platen press comprising:
    at least one tensile strength member having a first end and a second end;
    a stationary platen fixed to the first end of the tensile strength member;

at least one pressing cylinder for exerting longitudinal force, the cylinder having a stationary end and a moving end, the stationary end being coupled to the second end of the tensile strength member;

a movable platen coupled to the moving end of the cylinder, the movable platen and the stationary platen jointly defining a process chamber therebetween;

at least one heating platen disposed within the process chamber;

at least one seal cover disposed about the process chamber; and sliding seal between the seal cover and the tensile strength member for air sealing of the process chamber; whereby distortion of the seal cover and the tensile strength member is prevented.

2. The press according to claim 1, wherein the seal cover further includes a cylinder plate disposed between the movable platen and the second end of the tensile strength member and fixed to the tensile strength member, and another seal cover fixed in an airtight manner to the cylinder plate.

* * * * *